United States Patent
Geiger et al.

(10) Patent No.: US 12,270,824 B2
(45) Date of Patent: Apr. 8, 2025

(54) SENSOR SYSTEM, METHOD FOR OPERATING A SENSOR SYSTEM

(71) Applicant: Robert Bosch GmbH, Stuttgart (DE)

(72) Inventors: Wolfram Geiger, Gomaringen (DE); Istvan Kadar-Nemet, Budapest (HU); Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 789 days.

(21) Appl. No.: 17/393,807

(22) Filed: Aug. 4, 2021

(65) Prior Publication Data
US 2022/0057423 A1  Feb. 24, 2022

(30) Foreign Application Priority Data
Aug. 21, 2020  (DE) .......................... 102020210647.9

(51) Int. Cl.
| | | |
|---|---|---|
| *G01P 1/00* | (2006.01) | |
| *B81B 7/00* | (2006.01) | |
| *G01P 15/08* | (2006.01) | |
| *H01L 23/34* | (2006.01) | |
| *G01P 21/00* | (2006.01) | |

(52) U.S. Cl.
CPC .......... *G01P 1/006* (2013.01); *G01P 15/0802* (2013.01); *B81B 7/0087* (2013.01); *G01P 21/00* (2013.01); *H01L 23/34* (2013.01)

(58) Field of Classification Search
None
See application file for complete search history.

(56) References Cited

U.S. PATENT DOCUMENTS

| 11,073,531 B2 * | 7/2021 | deKoninck ............. G01P 1/006 |
| 2014/0250969 A1 * | 9/2014 | Alagarsamy .......... B81C 99/005 |
| | | 73/1.01 |
| 2019/0100426 A1 | 4/2019 | Painter et al. |
| 2020/0039818 A1 | 2/2020 | Ho |
| 2021/0053820 A1 | 2/2021 | Gurin et al. |

FOREIGN PATENT DOCUMENTS

| DE | 102009000167 A1 | 7/2010 |
| DE | 102015217921 A1 | 3/2017 |
| DE | 102019218334 A1 | 5/2021 |
| EP | 0244581 A1 | 11/1987 |
| EP | 0773443 A1 | 5/1997 |

OTHER PUBLICATIONS

Nagel et al., "Radiometric Effects in MEMS Accelerometers," 2017 IEEE Sensors, Glasgow, 2017, pp. 1-3.

* cited by examiner

*Primary Examiner* — Walter L Lindsay, Jr.
*Assistant Examiner* — Geoffrey T Evans
(74) *Attorney, Agent, or Firm* — NORTON ROSE FULBRIGHT US LLP; Gerard A. Messina

(57) ABSTRACT

A sensor system including a chip arrangement, the chip arrangement including a sensor and an acceleration sensor, and the sensor system including a processor circuit. The processor circuit is configured in such a way that: one or multiple temperature-dependent variables and/or properties of the sensor are ascertained, and an offset of a signal of the acceleration sensor induced by a temperature gradient is corrected with the aid of the one or the multiple ascertained temperature-dependent variables and/or properties of the sensor.

15 Claims, 4 Drawing Sheets

SENSOR SYSTEM, METHOD FOR OPERATING A SENSOR SYSTEM

CROSS REFERENCE

The present application claims the benefit under 35 U.S.C. § 119 of German Patent Application No. DE 102020210647.9 filed on Aug. 21, 2020, which is expressly incorporated herein by reference in its entirety.

FIELD

The present invention is directed to a sensor system.

BACKGROUND INFORMATION

Micro-electromechanical systems (MEMS), such as micromechanical inertial sensors, for example, for measuring acceleration and/or rotation rate, are manufactured for various applications in mass production. Such sensors are thus used, among other things, in a variety of applications in the automotive and consumer areas. For capacitive acceleration sensors including detection direction perpendicular to the wafer plane (z direction), "rockers" are often used. The sensor principle of these rockers is based on a spring-mass system, in which in the simplest case a movable seismic mass including two counter electrodes fixed on the substrate forms two plate capacitors. The seismic mass is connected to the substrate via one or multiple torsion springs. If the mass structures on the two sides of the torsion springs are of different sizes (for example due to an additional mass on one side), the mass will thus rotate in relation to the torsion spring as the rotational axis upon the action of a z acceleration, which results in a rocker movement. The spacing of the electrodes thus becomes less on the side having the greater mass structure and becomes greater on the other side. The capacitance change is a measure of the acting acceleration. Such acceleration sensors are described, for example, in European Patent Nos. EP 0 244 581 A1 and EP 0 773 443 B1. The acceleration sensors are typically hermetically encapsulated for protection from environmental influences and to ensure a defined fluidic damping, which codetermines the transmission behavior of the sensor, a defined gas pressure being enclosed in the sensor cavity.

Such rockers are widespread, but have some technical problems, which obstruct applications having very high demands on the offset stability. The offset stability may be massively improved by modern design forms of the rockers, for example as described in German Patent Application No. DE 10 2009 000 167 A1, but the demands for the offset stability for various applications also increase again and again. Therefore, this parameter remains a particularly critical performance aspect.

A relevant error mechanism with respect to the offset stability of acceleration sensors is the occurrence of radiometric forces, which form in the case of inhomogeneous temperature distributions within the sensor cavity. For example, if the sensor is located in the vicinity of a heat source, for example, an application processor on the printed circuit board (PCB) of a smart phone, depending on the relative position of the sensor in relation to the heat source, a vertical or lateral temperature gradient or also a combination thereof may form in the sensor module. Therefore, a temperature gradient also forms in the MEMS acceleration sensor chip itself. The temperatures of the movable rocker and the MEMS substrate are accordingly not in thermal equilibrium. The MEMS substrate including the base electrodes may be somewhat warmer than the rocker structure, for example. Movements of the gas particles in the sensor cavity are induced by such thermal gradients, the impacts of which with the movable sensor structure may result in measurable parasitic deflections of the rockers and thus offset signals. The effect is described in C. Nagel, T. Zoller, F. Ante, J. Classen, M. Putnik, and J. Mehner, "Radiometric effects in MEMS accelerometers," 2017 IEEE SENSORS, Glasgow, 2017, pp. 1-3, doi: 10.1109/ICSENS.2017.8233871. The TGO ("temperature gradient offset", i.e., an offset induced by temperature gradients) is introduced as a characteristic variable therein. The offset change due to a temperature gradient is sensitively dependent on the process technology, in particular the pressure and the type of the enclosed gas, and the properties of the MEMS structure, in particular its symmetry properties, but also, for example, the number and size of perforation holes in the movable structure.

Various methods are described in the related art to minimize the TGO effects for acceleration sensors. Lateral temperature gradients within the MEMS chip may be largely compensated for by situating two rocker structures situated pivoted by 180°, as described, for example, in U.S. Patent Application Publication No. US 2019/0100426 A1. Both rockers do deflect slightly, but thanks to the arrangement rotated by 180°, the parasitic electrical signals of the two rockers precisely compensate for one another, since once the lighter rocker side and once the heavier rocker side faces toward the warm side.

In the case of vertical temperature gradients, however, the double arrangement does not help, since the heavy rocker sides deflect in the same direction in both rockers. However, this precisely corresponds to the movement of the two rockers in the event of an acceleration in the z direction, so that the parasitic TGO signal is not differentiable from a real acceleration.

A compensation method is described in U.S. Patent Application Publication No. U.S. 2020 0 039 818 A1, in which at least one thermocouple element is implemented via additional bond wires, which are situated on the outside of the MEMS chip, to compare the local temperature on the MEMS rear side to the ASIC (application-specific integrated circuit) temperature and, derived from the ascertained temperature difference, to apply a correction value for the offset of the acceleration sensor. However, the method is technically complex, since, on the one hand, additional bond wires are necessary, which also limit the minimal achievable package thickness, and, on the other hand, additional area in the analog part of the evaluation ASIC is necessary to read out the thermocouple elements.

Up to this point, temperature gradients have been discussed in conjunction with z acceleration sensors. However, TGO effects may also occur in lateral acceleration sensors (or x/y sensors), thus sensors including detection direction in parallel to the substrate surface of the MEMS chip.

SUMMARY

It is an object of the present invention to provide a sensor system and a method for operating a sensor system, using which the performance of an acceleration sensor, in particular an offset stability of the acceleration sensor, may be efficiently improved.

The sensor system according to an example embodiment of the present invention may have an advantage over the related art that with the aid of a sensor, an offset of a signal of an acceleration sensor induced by a temperature gradient may be corrected. In this way, a cost-effective and high-quality offset correction for the acceleration sensor becomes possible, which may advantageously be achieved without extensive additional technological or manufacturing implications. It is thus possible according to the present invention to efficiently correct parasitic TGO effects in an acceleration sensor within a sensor system, for example, an IMU (inertial measurement unit), which includes a sensor and at least one single-axis acceleration sensor.

The specific example embodiments and advantages of the present invention notice are applicable to z acceleration sensors, but also to lateral acceleration sensors or to combined acceleration sensors, including a detection axis in the z direction and at least one lateral detection axis.

It is conventional in the related art that ASIC evaluation chips or ASIC structures of inertial sensors may include integrated temperature sensors, for example, to be able to correct offset and/or sensitivity errors via the temperature. For example, such temperature sensors may be used to compensate for the slight increase resulting with rising temperature of the sensitivity of MEMS acceleration sensors due to the softening of the silicon springs (the temperature coefficient of the modulus of elasticity of silicon is in the range of 60 ppm/K to 70 ppm/K). However, it is not possible to ascertain a temperature gradient using a temperature sensor integrated in the ASIC alone, in order to compensate for the TGO of the acceleration sensor.

According to the present invention, in contrast, the correction or the compensation of an offset of a signal of an acceleration sensor induced by a temperature gradient is possible. For this purpose, according to the present invention, one or multiple temperature-dependent variables and/or properties of a sensor are ascertained. With the aid of the one or the multiple ascertained temperature-dependent variables and/or properties of the sensor, an offset of the signal of the acceleration sensor induced by the temperature gradient is corrected.

Advantageous designs and refinements of the present invention may be inferred from the description herein with reference to the figures.

In that, according to one specific embodiment of the present invention, the chip arrangement includes a MEMS chip arrangement, the MEMS chip arrangement including at least one MEMS chip including the acceleration sensor, it is advantageously possible to estimate the temperature in the MEMS functional layer of the acceleration sensor, in particular with the aid of the sensor. The sensor is preferably also part of the MEMS chip arrangement. It is possible that the sensor is formed in the same MEMS chip as the acceleration sensor. In this case, it is possible that the MEMS chip arrangement only includes one chip, the shared MEMS chip. However, it is also possible that the sensor is formed in a further MEMS chip of the MEMS arrangement, so that the MEMS chip arrangement includes at least two chips, the MEMS chip and the further MEMS chip.

In that, according to one specific embodiment of the present invention, the offset of the signal of the acceleration sensor induced by the temperature gradient is caused by a temperature gradient in a perpendicular direction, perpendicular to a main extension plane of the MEMS chip including the acceleration sensor, the MEMS chip including the acceleration sensor preferably including the temperature gradient in the perpendicular direction, particularly preferably between a substrate and a cap of the MEMS chip, it is possible to correct or compensate for TGO effects which are caused by vertical temperature gradients.

In that, according to one specific embodiment of the present invention, the chip arrangement includes an ASIC structure, the MEMS chip arrangement and the ASIC structure preferably being situated offset in the perpendicular direction, the processor circuit being designed in such a way that the offset of the signal of the acceleration sensor induced by the temperature gradient is corrected in that with the aid of the one or the multiple ascertained temperature-dependent variables and/or properties of the sensor, a temperature difference between the ASIC structure and the sensor is ascertained and/or estimated, and the offset of the signal of the acceleration sensor induced by the temperature gradient is corrected with the aid of the ascertained and/or estimated temperature difference, it is possible that a temperature of the sensor or a temperature of a functional layer of the sensor, which is compared to an ASIC temperature, is determined via the ascertained temperature-dependent variables and/or properties of the sensor. The ASIC structure is preferably offset at least in the perpendicular direction, thus vertically, from the MEMS chip arrangement and thus the sensor and the acceleration sensor. A temperature difference between the MEMS chip arrangement and the ASIC structure may thus be ascertained. A temperature gradient in the perpendicular direction which is present in the MEMS chip may be estimated therefrom.

In that, according to one specific embodiment of the present invention, the ASIC structure includes an integrated temperature sensor or a temperature sensor is associated with the ASIC structure, the temperature sensor being configured in such a way that a temperature of the ASIC structure is ascertained with the aid of the temperature sensor, the processor circuit being configured in such a way that the temperature difference between the ASIC structure and the sensor is ascertained and/or estimated with the aid of the one or the multiple ascertained temperature-dependent variables and/or properties of the sensor and in addition with the aid of the ascertained temperature of the ASIC structure, it is possible that the temperature of the ASIC structure may be measured or determined via a temperature sensor. This measured temperature of the ASIC structure may then be used jointly with the temperature of the sensor, which may be ascertained via the one or the multiple temperature-dependent variables and/or properties of the sensor, to ascertain the temperature difference between the ASIC structure and the sensor. The temperature difference thus ascertained may then be used for compensation of the offset of the acceleration sensor induced by the temperature gradient.

In that, according to one specific embodiment of the present invention, the processor circuit is designed in such a way that the offset of the signal of the acceleration sensor induced by the temperature gradient is corrected with the aid of the following relationship:

$$\text{Offset}_{corrected} = \text{Offset}_{measured} - \text{const}_{TGO} * dT,$$

$\text{Offset}_{corrected}$ being the corrected offset of the signal of the acceleration sensor, $\text{Offset}_{measured}$ being a measured offset of the signal of the acceleration sensor, $\text{const}_{TGO}$ being a constant factor, dT being the temperature difference between the ASIC structure and the sensor, $\text{const}_{TGO}$ in particular being a factor specific to a sensor type and/or a sensor channel, $\text{const}_{TGO}$ preferably being ascertainable in a qualification phase and/or startup phase of the sensor system, it is particularly advantageously possible to carry out a TGO compensation for an offset of an acceleration sensor which is caused by vertical temperature gradients in the MEMS chip.

In that, according to one specific embodiment of the present invention, the signal of the acceleration sensor is a signal of a first axis of the acceleration sensor, the acceleration sensor having at least one second axis, the processor circuit being configured in such a way that, with the aid of the one or the multiple ascertained temperature-dependent variables and/or properties of the sensor, an offset of a further signal of the second axis of the acceleration sensor induced by a temperature gradient is corrected, it is possible to correct TGO effects for a multi-axis acceleration sensor. An offset induced by the temperature gradient for a third axis of the acceleration sensor may also be corrected in a corresponding way.

In that, according to one specific embodiment of the present invention, the sensor is a rotation rate sensor, it is advantageously possible to use the correction methods according to the various specific embodiments of the present invention for a sensor system which includes an acceleration sensor and a rotation rate sensor. Therefore, local temperature gradients within a combined rotation rate and acceleration rate sensor may be estimated by temperature-dependent variables and/or properties of the rotation rate sensor and the information obtained therefrom may be used to correct the offset signal of the acceleration sensor. The rotation rate sensor may include one or multiple detection axes.

In general, a temperature gradient within the MEMS chip in which the rotation rate sensor is situated does not cause significant signal changes in the rotation rate sensor, neither with respect to sensitivity nor with respect to offset or noise. In an IMU (inertial measurement unit), in which an acceleration sensor and a rotation rate sensor are situated in the same housing, accordingly only the acceleration channels are influenced by the temperature gradient. For this reason as well, the rotation rate sensor may be used particularly advantageously to ascertain the temperature of the MEMS functional layer.

In that, according to one specific embodiment of the present invention, the one or the multiple temperature-dependent variables and/or properties include one or multiple of the following variables and/or properties:
  a drive frequency of the rotation rate sensor,
  a drive quality of a drive oscillation of the rotation rate sensor,
  a drive voltage required to obtain a fixed oscillation amplitude of a drive oscillation of the rotation rate sensor,
  a quadrature of the rotation rate sensor, it is advantageously possible to use temperature-dependent variables and/or properties of the rotation rate sensor, with the aid of which a temperature may be measured in a functional layer of the rotation rate sensor itself and which may be read out anyway or at least may be read out without great effort in many cases. Therefore, in a particularly advantageous manner, no additional technical provisions (for example additional bond wires and/or additional analog evaluation circuits) are necessary.

In that, according to one specific embodiment of the present invention, the processor circuit includes a microcontroller or is designed as a microcontroller, it is possible to implement an advantageous processor circuit which may carry out the reading out of the signals and the signal correction of the offset of the signal of the acceleration sensor.

Another subject matter of the present invention is a method for operating a sensor system according to one specific embodiment of the present invention,
  in an ascertainment step, one or multiple temperature-dependent variables and/or properties of the sensor being ascertained, and
  in a correction step, an offset of a signal of the acceleration sensor induced by a temperature gradient being corrected with the aid of the one or the multiple ascertained temperature-dependent variables and/or properties of the sensor.

According to one specific embodiment of the present invention, in particular the method, it is possible that the chip arrangement includes an ASIC structure, the ASIC structure including an integrated temperature sensor or a temperature sensor being associated with the ASIC structure,
  in an ASIC temperature ascertainment step, with the aid of the temperature sensor, a temperature of the ASIC structure being ascertained,
  in a temperature difference ascertainment step, with the aid of the processor circuit, a temperature difference between the ASIC structure and the sensor being ascertained and/or estimated with the aid of the one or the multiple ascertained temperature-dependent variables and properties of the sensor and with the aid of the ascertained temperature of the ASIC structure,
  in the correction step, with the aid of the processor circuit, the correction of the offset of the signal of the acceleration sensor induced by the temperature gradient being carried out as a function of the temperature difference ascertained and/or estimated in the temperature difference ascertainment step, it is advantageously possible to implement an efficient correction of the offset of the signal of an acceleration sensor induced by the temperature gradient. The sensor is preferably a rotation rate sensor.

According to one preferred specific embodiment of the present invention, it is possible in particular that the temperature in the MEMS functional layer of the rotation rate sensor may be ascertained by the temperature-dependent variables and/or properties of the rotation rate sensor. The temperature-dependent variables and/or properties (or parameters) of the rotation rate sensor may be read out by the processor circuit, preferably by the microcontroller. In addition, the ASIC temperature may be evaluated by the processor circuit. If both temperatures correspond, as is the case in thermal equilibrium between ASIC chip and MEMS chip, the signals of the acceleration sensor are output unchanged and in particular are not corrected. Upon the presence of a temperature difference between ASIC structure and rotation rate sensor, in contrast, the temperature gradient within the MEMS chip is estimated via the processor circuit, and the offset signals of the acceleration sensor channels are output with a suitable correction which just compensates for the TGO-related error signals. The temperature-dependent variables and/or properties of the rotation rate sensor may be in particular the drive frequency of the rotation rate sensor, and/or the drive quality of the rotation rate sensor, and/or the drive voltage of the rotation rate sensor required to obtain a fixed oscillation amplitude, and/or the quadrature of the rotation rate sensor (in particular if the quadrature of the rotation rate sensor is temperature dependent).

The advantages and designs which have already been described in conjunction with the sensor system according to the present invention or in conjunction with a specific embodiment of the sensor system according to the present invention may be applied for the method for operating a sensor system.

Exemplary embodiments of the present invention are shown in the figures and are explained in greater detail below.

DETAILED DESCRIPTION OF EXAMPLE EMBODIMENTS

Figure 1:
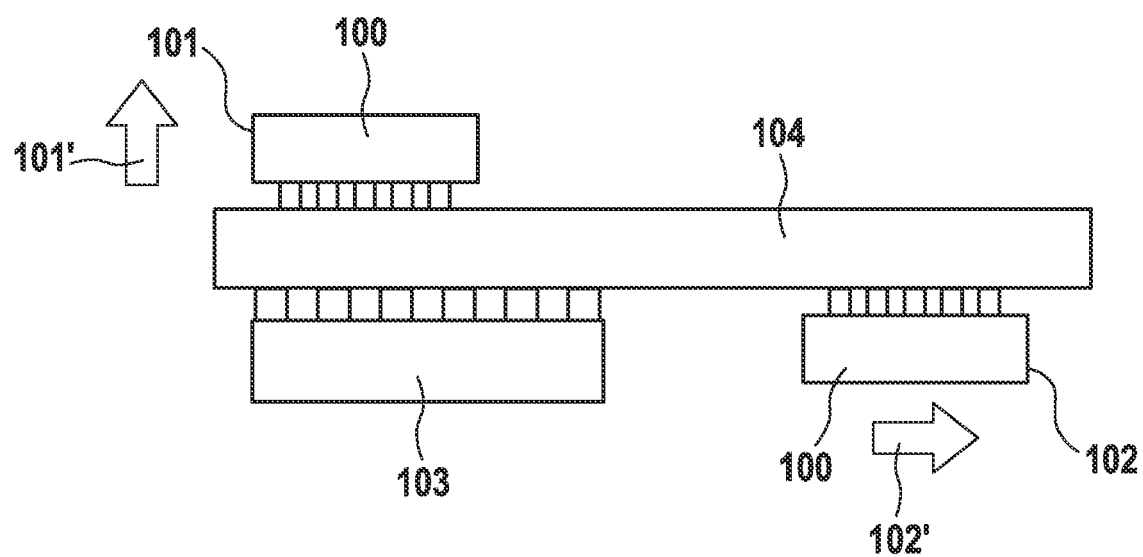
FIG. 1 shows a schematic representation of a heat source which causes a temperature gradient.

In the various figures, identical parts are always provided with identical reference numerals and generally are therefore each also only named or mentioned once.

FIG. 1 shows a schematic representation of a heat source 103, which may cause a temperature gradient in a sensor or a chip arrangement 100. Chip arrangement 100 is located in the vicinity of heat source 103, for example in the vicinity of an application processor 103 on printed circuit board (PCB) 104 of a smart phone. Depending on the relative position of chip arrangement 100 in relation to heat source 103, a vertical or lateral temperature gradient or also a combination thereof will form in the sensor module. For example, for the case in which chip arrangement 100 is situated at a first position 101 according to FIG. 1, a vertical temperature gradient results within MEMS chip 100, symbolized by block arrow 101'. For the case in which chip arrangement 100 is situated at a second position 102 according to FIG. 1, a lateral temperature gradient results within MEMS chip 100, symbolized by block arrow 102'. In this case, chip arrangement 100 means the entire sensor or the entire sensors including MEMS chip, evaluation ASIC, and outer packaging, for example, LGA substrate and molding compound. Therefore, a temperature gradient also forms in MEMS chip 13, which includes acceleration sensor 11 and is part of chip arrangement 100. The temperatures of a movable structure of the acceleration sensor (for example a rocker structure) and of substrate 13' of MEMS chip 13 are accordingly not in thermal equilibrium. Substrate 13' including the base electrodes may, for example, be somewhat warmer than the movable structure of acceleration sensor 11. Movements of the gas particles in the sensor cavity are induced by the thermal gradient, the impacts of which with the movable sensor structure may result in measurable parasitic deflections of the movable sensor structure (for example the rocker) and thus in offset signals.

Figure 2A:
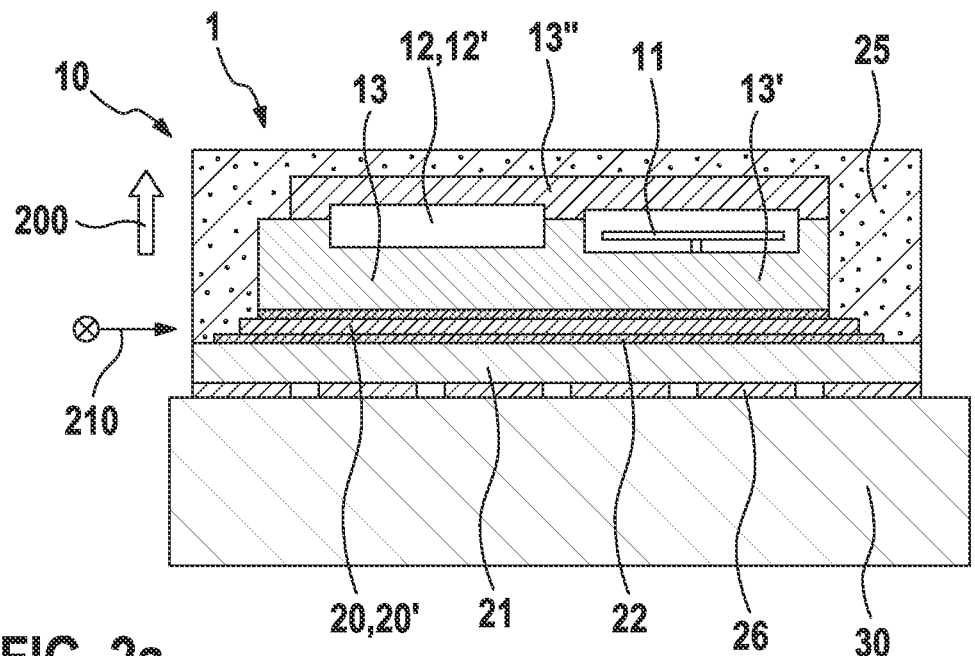
FIGS. 2a and 2b show schematic representations of chip arrangements according to different specific embodiments of the present invention.

FIG. 2a shows a schematic representation of a chip arrangement 1 according to one specific embodiment of the present invention. FIG. 2a shows a MEMS chip arrangement 10 of a sensor 12 designed as a rotation rate sensor 12' and an acceleration sensor 11. Rotation rate sensor 12' and acceleration sensor 11 are situated here on the same MEMS chip 13. Chip arrangement 1 or MEMS chip arrangement 10 thus includes only one single MEMS chip 13, which in turn includes sensors 11, 12'. MEMS chip 13 includes a substrate 13' and a cap 13", with the aid of which cavities for sensors 11, 12' are formed. MEMS chip 13 is connected mechanically, for example, via an adhesive, and electrically, for example, via bond wires (not shown in the figure) or alternatively solder balls to an evaluation ASIC structure 20. ASIC structure 20 is situated in a perpendicular direction 200, perpendicular to a main extension plane 210 of MEMS chip 13 (or perpendicular to a substrate plane), below MEMS chip 13. ASIC structure 20 is mechanically connected via a further adhesive layer 22 to substrate 21 of the LGA housing.

Figure 2B:
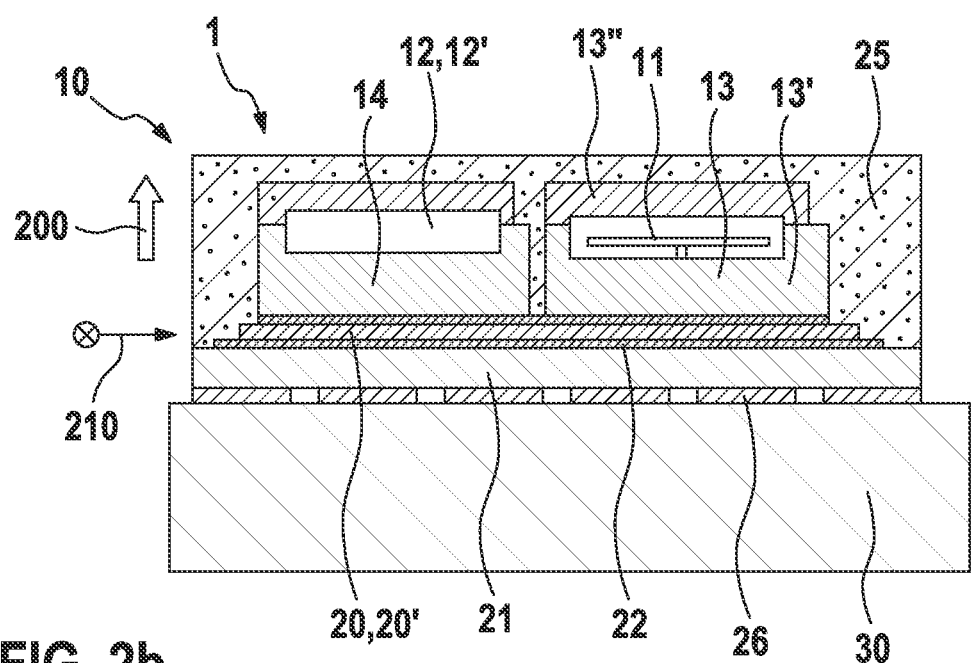

MEMS chip 13 and ASIC structure 20 are cast using a molding compound 25 for mechanical protection. Sensors 11, 12' are mechanically and electrically connected to printed circuit board 204 via solder contacts 26 of LGA substrate 21. ASIC structure 20 includes an integrated temperature sensor 20', using which a temperature of ASIC structure 20 may be ascertained or measured. FIG. 2b shows a schematic representation of a chip arrangement 1 according to another specific embodiment of the present invention. The further specific embodiment according to FIG. 2b differs from the specific embodiment shown in FIG. 2a in that sensor 12 designed as rotation rate sensor 12' and acceleration sensor 11 are each situated in separate MEMS chips 13, 14. Chip arrangement 1 thus includes a MEMS chip arrangement 10, which includes a MEMS chip 13 including acceleration sensor 11 and a further MEMS chip 14 including rotation rate sensor 12'. Chip arrangement 1 or MEMS chip arrangement 10 thus includes two separate MEMS chips 13, 14, which are situated adjacent to one another. The two MEMS chips 13, 14 are jointly cast using molding compound 25.

Figure 3:
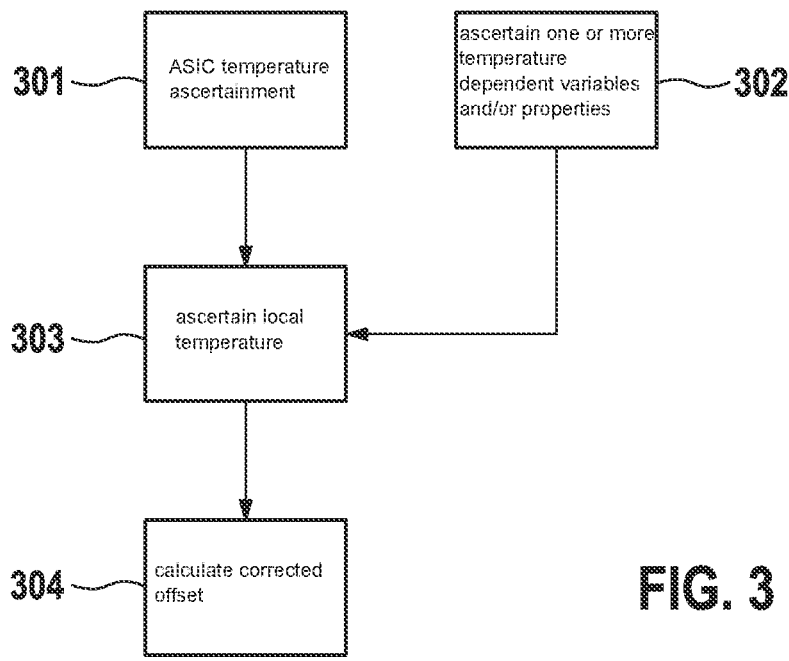
FIG. 3 schematically shows a method according to one specific embodiment of the present invention.

FIG. 3 schematically shows a flowchart of a method according to one specific embodiment of the present invention, using which it is possible to compensate for or correct the TGO of acceleration sensor 11.

In an ASIC temperature ascertainment step 301, a temperature of ASIC structure 20 is ascertained with the aid of temperature sensor 20' and read out by a processor circuit 40 (for example a microcontroller).

In an ascertainment step 302, before, during, and/or after ASIC temperature ascertainment step 301, one or multiple temperature-dependent variables and/or properties of rotation rate sensor 12' are ascertained or read out by processor circuit 40. The one or the multiple temperature-dependent variables and/or properties may be, for example, a drive frequency of rotation rate sensor 12'. The following exemplary embodiment is explained on the basis of the drive frequency of rotation rate sensor 12'. However, the use of other temperature-dependent variables and/or properties of rotation rate sensor 12' is alternatively or additionally also possible.

From the drive frequency of rotation rate sensor 12', processor circuit 40 ascertains, in a temperature difference ascertainment step 303 with the aid of a stored algorithm, the local temperature in the area of the MEMS functional layer of rotation rate sensor 12' or the temperature difference between the temperature of the MEMS functional layer $T_{MEMS}$ of rotation rate sensor 12' and the temperature of the ASIC structure $T_{ASIC}$.

The corresponding calculation may appear as follows, for example:

$$dT = T_{MEMS} - T_{ASIC} = \frac{Freq(T + dT) - Freq(T)}{\frac{dFreq(T)}{dT}}.$$

In this case:

Freq(T+dT) is the drive frequency presently read out by processor circuit 40, Freq(T) is the drive frequency which rotation rate sensor 12' has in thermal equilibrium (ASIC temperature=MEMS temperature) at temperature T, and dFreq(T)/dT is the temperature dependence of the drive frequency in thermal equilibrium. This is dominant in a silicon-based MEMS rotation rate sensor 12' over the above-mentioned temperature dependence of elasticity coefficient E, is determined by silicon, and is therefore (because of the relationship Freq~E^0.5) in the range of −30 ppm/K to 35 ppm/K.

Due to the arrangement of rotation rate sensor 12' and acceleration sensor 11 on the same MEMS chip 13 or on different MEMS chips 13, 14 of the same MEMS chip arrangement 10, the MEMS functional layer of acceleration sensor 11 has a similar temperature as the MEMS functional layer of rotation rate sensor 12', so that the local temperature of acceleration sensor 11 may also be inferred from the ascertained local temperature of rotation rate sensor 12'.

In a correction step 304, a corrected offset of acceleration sensor 11 is calculated in processor circuit 40 from ascertained temperature difference dT or the ascertained temperature difference between rotation rate sensor 12' and ASIC structure 20, preferably a correction proportional with respect to the ascertained temperature difference according to $$\text{Offset}_{corrected,i} = \text{Offset}_{measured,i} - \text{const}_{TGO,i} * dT,$$

$\text{Offset}_{corrected,i}$ being the corrected offset of the signal of the acceleration sensor, $\text{Offset}_{measured,i}$ being a measured offset of the signal of the acceleration sensor, $\text{const}_{TGO,i}$ being a constant factor, in particular specific to the sensor type and/or the sensor channel, dT being the temperature difference $T_{MEMS} - T_{ASIC}$ between ASIC structure 20 and rotation rate sensor 12'. Factor $\text{const}_{TGO,i}$ may be determined in a qualification phase and/or startup phase of the sensor system. Index i in the above formula denotes possible detection axes or sensing directions x, y, z. Each channel of acceleration sensor 11 generally requires a separate correction coefficient.

Steps 301, 302, 303, 304 may preferably be carried out by or with the aid of a processor circuit 40 designed as a microcontroller.

Figure 4:
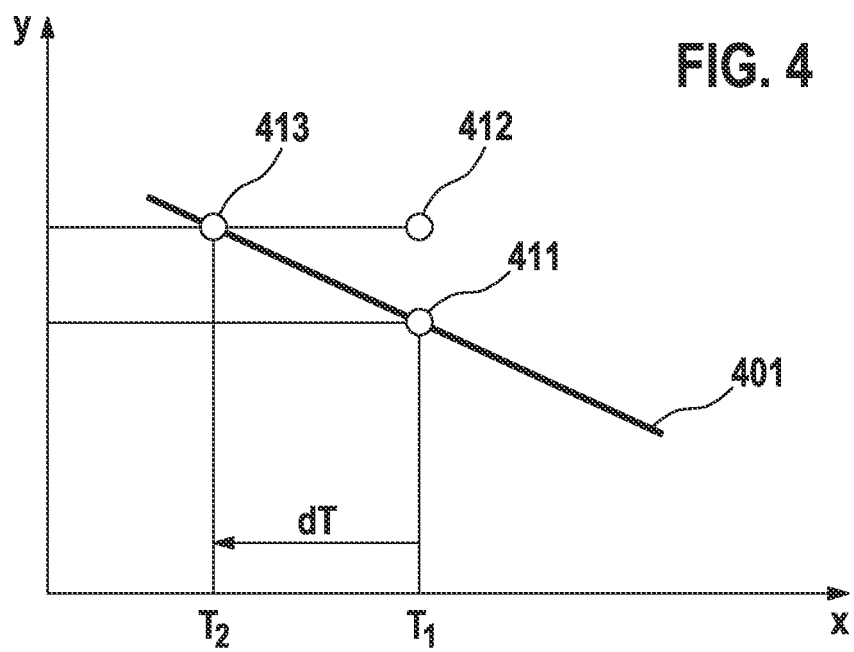
FIG. 4 schematically shows an ascertainment of a temperature difference according to one specific embodiment of the present invention.

FIG. 4 shows an ascertainment of a temperature difference dT between rotation rate sensor 12' and ASIC structure 20 according to one specific embodiment of the present invention in a graph. The temperature of the ASIC structure is plotted on the x axis and the drive frequency of rotation rate sensor 12' is plotted on the y axis. In thermal equilibrium (rotation rate sensor 12' and ASIC structure 20 have an identical temperature), the drive frequency of rotation rate sensor 12' follows characteristic curve 401. If value $T_1$ is measured for the temperature of the ASIC structure, the drive frequency of rotation rate sensor 12' would thus have to be at point 411. If a higher drive frequency of rotation rate sensor 12' is actually measured/ascertained at point 412, this thus indicates that the local temperature in the MEMS functional layer of rotation rate sensor 12' is lower than measured temperature value $T_1$ of the ASIC structure. In thermal equilibrium between MEMS and ASIC, the measured drive frequency would result at a lower ASIC temperature $T_2$ (point 413 on characteristic curve 401). Temperature difference $dT = T_2 - T_1$ thus corresponds to the temperature difference between MEMS functional layer of rotation rate sensor 12' and ASIC structure 20 and, due to the vertically stacked arrangement (thus in perpendicular direction 200) of ASIC structure 20 and MEMS chip arrangement 10, is also a measure of the local temperature gradient within MEMS chip 13 including acceleration sensor 11, which is responsible for the size of the parasitic TGO effects.

Ideally, it is possible that the correction coefficients or factors in the course of mass production are identical for all exemplars of the same sensor or sensor type. However, if fundamental properties change in the structure of the sensor, which may have an influence on the temperature distribution in the sensor, e.g., the thicknesses of ASIC structure 20, the MEMS substrate, or the molding compound above MEMS chips 13, 14, redetermining the correction coefficients is generally necessary or at least advantageous.

For precise direct measurement of the drive frequency of the rotation rate sensor, it may be advantageous for processor circuit 40 or the microcontroller, in addition to ASIC-internal variables, to also tap signals of an external clock generator, for example a frequency-stabilized oscillator, and compare them to the ASIC-internal signal. Such an oscillator would typically not be integrated in the sensor module itself.

In the course of FIGS. 3 and 4, a specific example embodiment of the method was described in which the drive frequency of rotation rate sensor 12' was used as the temperature-dependent variable or property of rotation rate sensor 12'. However, alternatively or additionally to the drive frequency, other variables of a sensor 12 or a rotation rate sensor 12' are also usable. Alternative variables or properties of rotation rate sensor 12' for determining the local MEMS temperature may be, for example, the drive quality or drive voltage of rotation rate sensor 12'. In a sealed cavity, the quality of a mechanical resonator (thus also especially a rotation rate sensor 12') varies proportionally with 1/square root (T) with temperature T. The drive voltage of the sensors is generally updated in the event of temperature changes in such a way that the oscillation amplitude remains constant, so that the mechanical and electrical sensitivity of the sensor remains unchanged. The drive voltage varies in this case according to T^0.25, since the drive force is proportional to the square of the drive voltage. Therefore, the local temperature of the MEMS functional layer of the sensor may also be inferred by a precise measurement of the required drive voltage. In some rotation rate sensors, the quadrature (an interference signal phase shifted by 90° to the useful signal) varies with the temperature. If the relationship between quadrature and temperature is known, the local temperature of rotation rate sensor 12' may also be inferred from the measurement of the quadrature (or the voltages or signals required for compensation of the quadrature).

If measured variables other than the drive frequency are used, the above formulas are adapted accordingly and other or new correction coefficients or factors are type-specifically ascertained.

A sensor system including a chip arrangement 1 may thus be implemented, chip arrangement 1 including a sensor 12 and an acceleration sensor 11, the sensor system including a processor circuit 40, so that processor circuit 40 is configured in such a way that:

one or multiple temperature-dependent variables and/or properties of sensor 12 are ascertained, and with the aid of the one or the multiple ascertained temperature-dependent variables and/or properties of sensor 12, an offset of a signal of acceleration sensor 11 induced by a temperature gradient is corrected.

Figure 5A:
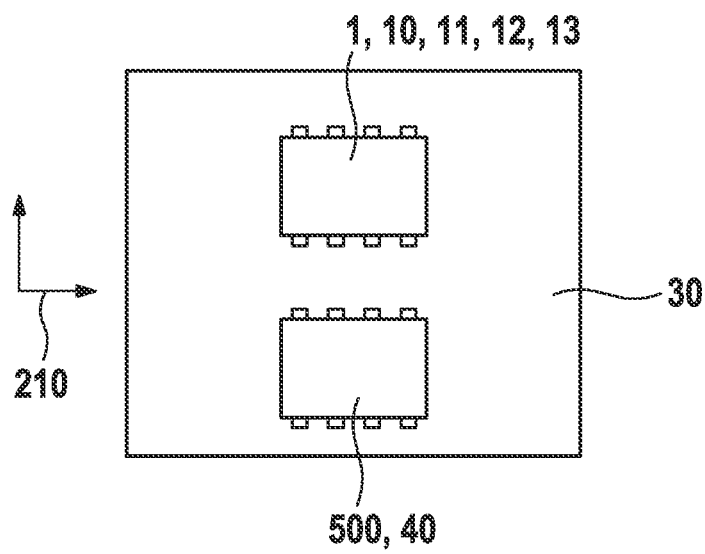
FIGS. 5a, 5b, and 5c show schematic views of a sensor system according to different specific embodiments of the present invention.
Figure 5B:
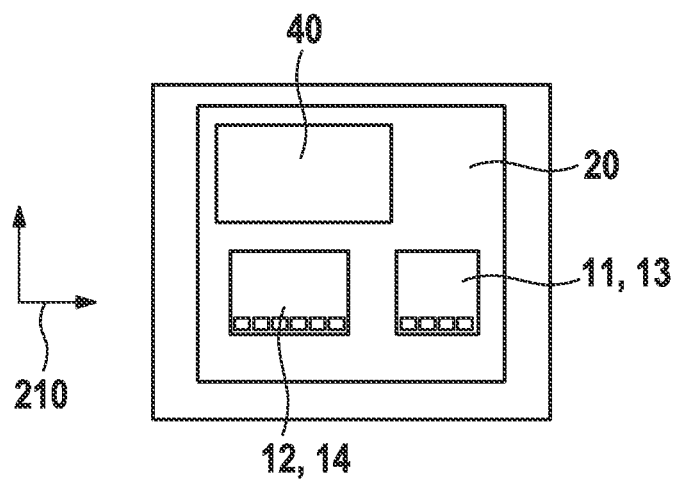
Figure 5C:
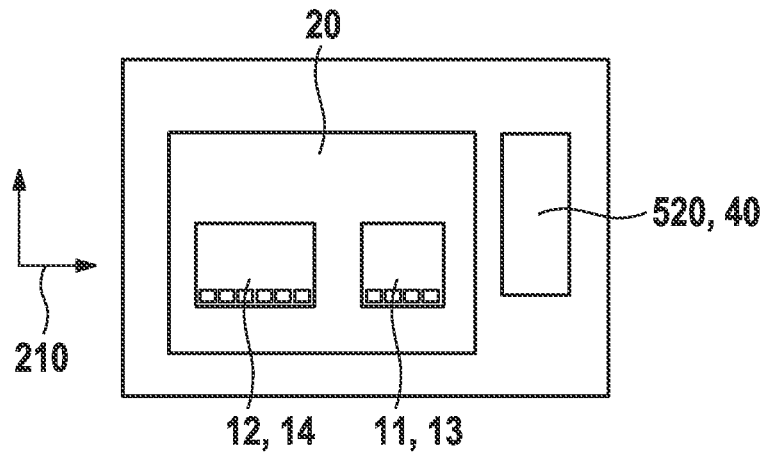

FIGS. 5a, 5b, and 5c show schematic representations of a sensor system 1 according to different specific example embodiments of the present invention, each in a top view of main extension plane 210. Processor circuit 40 is designed as a microcontroller in each case.

In FIG. 5a, the microcontroller for data correction is located outside chip arrangement 1, which includes MEMS chip arrangement 10 including sensor 12 and acceleration sensor 11. The microcontroller is mounted as a separate component 500 on application printed circuit board 30. Separate component 500, thus processor circuit 40, may be the application processor of a smart phone, for example.

In FIG. 5b, the microcontroller for data correction is located jointly with sensor 12 (or rotation rate sensor 12') and acceleration sensor 11 in the same sensor module. In particular, the microcontroller may be integrated in ASIC structure 20 or the ASIC evaluation chip or may be connected to ASIC structure 20. The sensor module would then contain, for example, three chips 13, 14, 20.

A further alternative arrangement is shown in FIG. 5c. The microcontroller is integrated as an independent chip 520 separate from ASIC structure 20 or the ASIC evaluation chip in the same sensor module. The sensor module then contains four chips 13, 14, 20, 520. Alternatively, to the examples shown in FIGS. 5b and 5c, it is also possible in each case to integrate acceleration sensor 11 and sensor 12 on a shared MEMS chip 13.

What is claimed is:

1. A sensor system, comprising:
a chip arrangement including a sensor and an acceleration sensor; and
a processor circuit configured in such a way that:
one or multiple temperature-dependent variables and/or properties of the sensor are ascertained, and
an offset of a signal of the acceleration sensor induced by a temperature gradient is corrected with using the one or the multiple ascertained temperature-dependent variables and/or properties of the sensor,
wherein the chip arrangement includes an ASIC structure,
wherein the ASIC structure includes an integrated temperature sensor configured to measure a temperature of the ASIC structure to thereby ascertain the temperature gradient between the chip arrangement and the ASIC structure.

2. The sensor system as recited in claim 1, wherein the chip arrangement includes a MEMS chip arrangement, the MEMS chip arrangement including at least one MEMS chip including the acceleration sensor.

3. The sensor system as recited in claim 2, wherein the offset of the signal of the acceleration sensor induced by the temperature gradient is caused by a temperature gradient in a perpendicular direction, perpendicular to a main extension plane of the MEMS chip including the acceleration sensor.

4. The sensor system as recited in claim 3, wherein the MEMS chip including the acceleration sensor has the temperature gradient in the perpendicular direction between a substrate and a cap of the MEMS chip.

5. The sensor system as recited in claim 1, wherein the signal of the acceleration sensor is a signal of a first axis of the acceleration sensor, the acceleration sensor having at least one second axis, the processor circuit being configured in such a way that an offset of a further signal of the second axis of the acceleration sensor induced by a temperature gradient is corrected with using the one or the multiple ascertained temperature-dependent variables and/or properties of the sensor.

6. The sensor system as recited in claim 1, wherein the sensor is a rotation rate sensor.

7. The sensor system as recited in claim 1, wherein the processor circuit includes a microcontroller or is a microcontroller.

8. A sensor system, comprising:
a chip arrangement including a sensor and an acceleration sensor; and
a processor circuit configured in such a way that:
one or multiple temperature-dependent variables and/or properties of the sensor are ascertained, and
an offset of a signal of the acceleration sensor induced by a temperature gradient is corrected with using the one or the multiple ascertained temperature-dependent variables and/or properties of the sensor,
wherein the chip arrangement includes a MEMS chip arrangement, the MEMS chip arrangement including at least one MEMS chip including the acceleration sensor,
wherein the offset of the signal of the acceleration sensor induced by the temperature gradient is caused by a temperature gradient in a perpendicular direction, perpendicular to a main extension plane of the MEMS chip including the acceleration sensor,
wherein the chip arrangement includes an ASIC structure, the processor circuit is configured in such a way that the offset of the signal of the acceleration sensor induced by the temperature gradient is corrected in such a way that:
with the aid of the one or the multiple ascertained temperature-dependent variables and/or properties of the sensor, a temperature difference between the ASIC structure and the sensor is ascertained and/or estimated, and
the offset of the signal of the acceleration sensor induced by the temperature gradient is corrected with the aid of the ascertained and/or estimated temperature difference.

9. The sensor system as recited in claim 8, wherein the MEMS chip arrangement and the ASIC structure are situated offset in the perpendicular direction.

10. The sensor system as recited in claim 8, wherein the temperature sensor is configured in such a way that a temperature of the ASIC structure is ascertained using the temperature sensor, the processor circuit being configured in such a way that the temperature difference between the ASIC structure and the sensor is ascertained and/or estimated with the one or the multiple ascertained temperature-dependent variables and/or properties of the sensor and additionally with the aid of the ascertained temperature of the ASIC structure.

11. The sensor system as recited in claim 8, wherein the processor circuit is configured in such a way that the offset of the signal of the acceleration sensor induced by the temperature gradient is corrected with the aid of the following relationship:

$$\text{Offset}_{corrected} = \text{Offset}_{measured} - \text{const}_{TGO} * dT,$$

wherein:
$\text{Offset}_{corrected}$ is the corrected offset of the signal of the acceleration sensor, Offset$_{measured}$ is a measured offset of the signal of the acceleration sensor, const$_{TGO}$ is a constant factor, dT is the temperature difference between the ASIC structure and the sensor, const$_{TGO}$ is a factor specific to a sensor type and/or a sensor channel.

12. The sensor system as recited in claim 11, wherein const$_{TGO}$ is ascertainable in a qualification phase and/or startup phase of the sensor system.

13. A sensor system, comprising:
a chip arrangement including a sensor and an acceleration sensor; and
a processor circuit configured in such a way that:
one or multiple temperature-dependent variables and/or properties of the sensor are ascertained, and
an offset of a signal of the acceleration sensor induced by a temperature gradient is corrected with using the one or the multiple ascertained temperature-dependent variables and/or properties of the sensor,
wherein the sensor is a rotation rate sensor,
wherein the one or the multiple temperature-dependent variables and/or properties include one or multiple of the following variables and/or properties:
a drive frequency of the rotation rate sensor,
a drive quality of a drive oscillation of the rotation rate sensor,
a drive voltage required to obtain a fixed oscillation amplitude of a drive oscillation of the rotation rate sensor,
a quadrature of the rotation rate sensor.

14. A method for operating a sensor system, the sensor system including a chip arrangement including a sensor and an acceleration sensor and a processor circuit, the method comprising the following steps:
in an ascertainment step, ascertaining one or multiple temperature-dependent variables and/or properties of the sensor; and
in a correction step, correcting an offset of a signal of the acceleration sensor induced by a temperature gradient using the one or the multiple ascertained temperature-dependent variables and/or properties of the sensor,
wherein the chip arrangement includes an ASIC structure,
wherein the ASIC structure includes an integrated temperature sensor configured to measure a temperature of the ASIC structure to thereby ascertain the temperature gradient between the chip arrangement and the ASIC structure.

15. A method, for operating a sensor system, the sensor system including a chip arrangement including a sensor and an acceleration sensor and a processor circuit, the method comprising the following steps:
in an ascertainment step, ascertaining one or multiple temperature-dependent variables and/or properties of the sensor; and
in a correction step, correcting an offset of a signal of the acceleration sensor induced by a temperature gradient using the one or the multiple ascertained temperature-dependent variables and/or properties of the sensor,
wherein the chip arrangement includes an ASIC structure), the ASIC structure including an integrated temperature sensor or a temperature sensor being associated with the ASIC structure, and wherein, in an ASIC temperature ascertainment step, a temperature of the ASIC structure is ascertained using the temperature sensor, in a temperature difference ascertainment step, with the aid of the processor circuit, a temperature difference between the ASIC structure and the sensor is ascertained and/or estimated with using the one or the multiple ascertained temperature-dependent variables and/or properties of the sensor and using the ascertained temperature of the ASIC structure, and in the correction step, with the aid of the processor circuit, the correction of the offset of the signal of the acceleration sensor induced by the temperature gradient is carried out as a function of the temperature difference ascertained and/or estimated in the temperature difference ascertainment step.

* * * * *